United States Patent
Shin et al.

(10) Patent No.: US 9,137,521 B2
(45) Date of Patent: Sep. 15, 2015

(54) DEPTH SENSING APPARATUS AND METHOD

(71) Applicant: SAMSUNG ELECTRONICS CO., LTD., Suwon-si (KR)

(72) Inventors: Jung Soon Shin, Yongin-si (KR); Seong Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 13/949,623

(22) Filed: Jul. 24, 2013

(65) Prior Publication Data

US 2014/0028883 A1    Jan. 30, 2014

(30) Foreign Application Priority Data

Jul. 24, 2012  (KR) .................. 10-2012-0080482
Apr. 19, 2013  (KR) .................. 10-2013-0043646

(51) Int. Cl.
  *H04N 13/02*  (2006.01)
  *G01S 17/89*  (2006.01)
  *G01S 7/486*  (2006.01)
  *G01S 7/487*  (2006.01)
  *H04N 5/378*  (2011.01)
  *H04N 5/353*  (2011.01)
  *H04N 5/369*  (2011.01)
  *H04N 5/363*  (2011.01)
  *H01L 27/146*  (2006.01)

(52) U.S. Cl.
  CPC ............ *H04N 13/0271* (2013.01); *G01S 7/487* (2013.01); *G01S 7/4863* (2013.01); *G01S 7/4865* (2013.01); *G01S 17/89* (2013.01); *H01L 27/14612* (2013.01); *H04N 5/353* (2013.01); *H04N 5/363* (2013.01); *H04N 5/3696* (2013.01); *H04N 5/378* (2013.01); *H01L 27/14643* (2013.01)

(58) Field of Classification Search
  CPC ................................................... H04N 13/0271
  USPC .......................................... 348/297; 702/159
  See application file for complete search history.

(56) References Cited

U.S. PATENT DOCUMENTS

2008/0079833 A1    4/2008   Ichikawa et al.
2012/0059625 A1*   3/2012   Kim et al. ..................... 702/159

FOREIGN PATENT DOCUMENTS

EP    2187237        5/2010
JP    2004-294420    10/2004

(Continued)

OTHER PUBLICATIONS

Extended European Search Report dated Oct. 29, 2013 in European Patent Application No. 13177764.1.

*Primary Examiner* — Joel Fosselman
(74) *Attorney, Agent, or Firm* — Harness, Dickey & Pierce

(57) ABSTRACT

A depth sensing apparatus and method for acquiring a depth image of a target object may calculate a difference voltage between a first floating diffusion node and a second floating diffusion node, based on a voltage of a photodiode stored in the first floating diffusion node in a first phase interval and a voltage of the photodiode stored in the second floating diffusion node in a second phase interval, using a sub-integration period, may feed back the difference voltage to one of the first floating diffusion node and the second floating diffusion node, and may calculate a depth value of a pixel based on difference voltages accumulated during an integration period including sub-integration periods.

27 Claims, 14 Drawing Sheets

(56) References Cited

FOREIGN PATENT DOCUMENTS

| | | |
|---|---|---|
| JP | 2008-32427 | 2/2008 |
| JP | 2009-267436 | 11/2009 |
| JP | 2010-71832 | 4/2010 |
| KR | 10-2005-0116158 | 12/2005 |
| KR | 10-2007-0009591 | 1/2007 |
| KR | 10-2010-0118772 | 11/2010 |
| KR | 10-2011-0051391 | 5/2011 |
| KR | 10-2012-0025858 | 3/2012 |
| WO | 2011/043251 | 4/2011 |
| WO | 2011/105438 | 9/2011 |

* cited by examiner

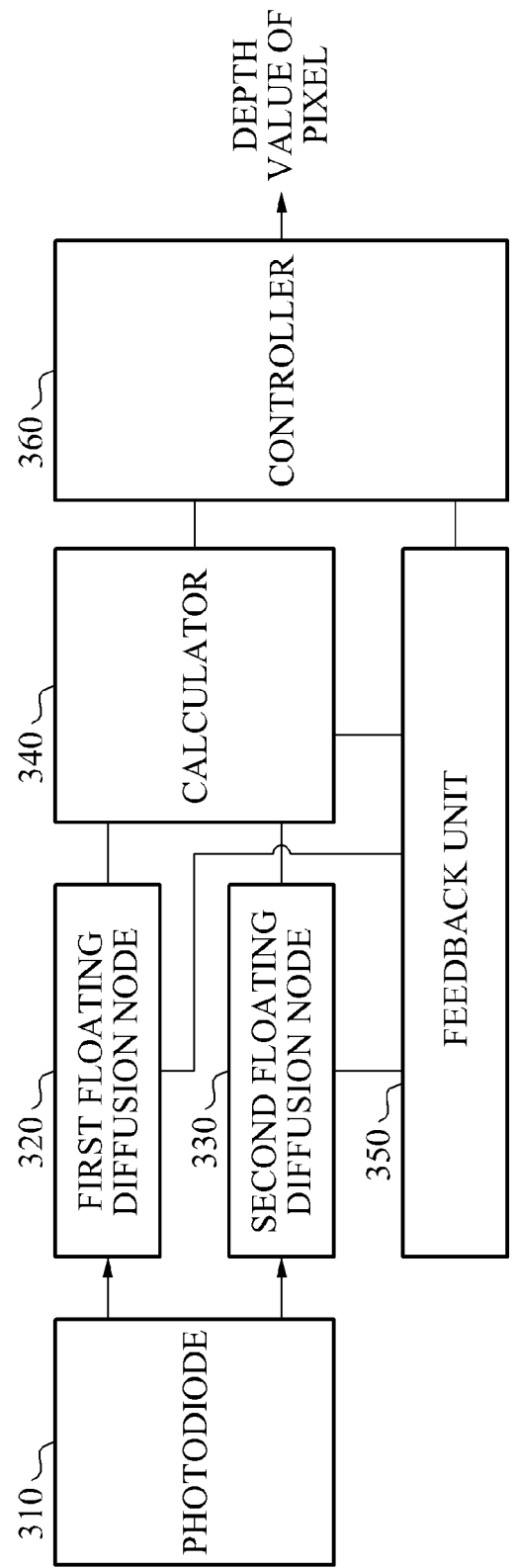

DEPTH SENSING APPARATUS AND METHOD

CROSS-REFERENCE TO RELATED APPLICATIONS

This application claims the priority benefit of Korean Patent Application No. 10-2012-0080482, filed on Jul. 24, 2012, and Korean Patent Application No. 10-2013-0043646, filed on Apr. 19, 2013, in the Korean Intellectual Property Office, the disclosures of which are incorporated herein by reference.

BACKGROUND

1. Field

The following description relates to a depth sensing apparatus and method that may acquire a depth image of a target object.

2. Description of the Related Art

A method of obtaining distance information from a sensor to an object may generally be classified into an active method and a passive method.

The passive method may be implemented by a stereo camera by calculating a distance from an object using only image information, instead of emitting light.

The active method may be implemented using a triangulation scheme of calculating a distance using a time of flight (TOF) and a triangulation. The TOF may measure a travel time of light by emitting the light towards an object and sensing the light reflected from the object, and the triangulation may sense a position of reflected light, the light being emitted by a laser positioned within a predetermined distance from a sensor.

In the case of the active method, because the light is directly emitted, it is possible to acquire a distance value in all the pixels of a sensor and thus, it is possible to provide a dense depth map. However, when background light is strong, distortion may occur in a depth value, because both the emitted light and the background light enter the sensor.

In addition, in the case of the active method, an error may occur. For example, if a pixel is saturated due to the background light, an accurate depth value may not be obtained. To increase a pixel's capacity, a size of a storage capacitor may be increased. However, an increased capacitance may result in a degradation of a space resolution and fill factor of the pixel. Accordingly, other methods of avoiding pixel saturation are being studied.

SUMMARY

The foregoing and/or other aspects are achieved by providing a depth sensing apparatus, including a calculator to calculate a difference voltage between a first floating diffusion node and a second floating diffusion node, based on a voltage of a photodiode stored in the first floating diffusion node in a first phase interval and a voltage of the photodiode stored in the second floating diffusion node in a second phase interval, using a sub-integration period, a feedback unit to feed back the difference voltage to one of the first floating diffusion node and the second floating diffusion node, and a controller to calculate a depth value of a pixel based on difference voltages accumulated during an integration period including sub-integration periods.

The controller may include a measurement unit to measure a voltage of the first floating diffusion node using a first unity gain amplifier and to measure a voltage of the second floating diffusion node using a second unity gain amplifier.

A positive input end of at least one of the first unity gain amplifier and the second unity gain amplifier may be included in a pixel circuit, and a remaining configuration may be included in a column circuit.

At least one of the first unity gain amplifier and the second unity gain amplifier may be included in a pixel circuit.

The controller may further include an offset cancellation unit to cancel an offset of the first unity gain amplifier and an offset of the second unity gain amplifier by controlling operation timing of a first switch connecting the first unity gain amplifier and an input end of a correlated double sampling (CDS) amplifier, a second switch connecting the second unity gain amplifier and the CDS amplifier, a third switch connecting a feedback capacitor and the CDS amplifier, a fourth switch of the CDS amplifier, a fifth switch connecting an output end of the CDS amplifier and the first floating diffusion node, and a sixth switch connecting the output end of the CDS amplifier and the second floating diffusion node.

The offset cancellation unit may turn on the first switch, the third switch, and the fourth switch when the voltage of the first floating diffusion node is greater than the voltage of the second floating diffusion node, may turn off the first switch and the fourth switch and then turn on the second switch, may turn off the second switch and the third switch and then turn on the fourth switch, the fifth switch, and the sixth switch, to thereby reset the voltage of the first floating diffusion node and the voltage of the second floating diffusion node to a reference voltage, may turn off the fifth switch and the sixth switch and then turn on the second switch, and may turn off the second switch and the fourth switch and then turn on the first switch and the third switch, thereby cancelling the offset of the first unity gain amplifier and the offset of the second unity gain amplifier.

The offset cancellation unit may turn on the second switch, the third switch, and the fourth switch when the voltage of the floating diffusion node is less than or equal to the voltage of the second floating diffusion node, may turn off the second switch and the fourth switch and then turn on the first switch, may turn off the first switch and the third switch and then turn on the fourth switch, the fifth switch, and the sixth switch to thereby reset the voltage of the first floating diffusion node and the voltage of the second floating diffusion node to a reference voltage, may turn off the fifth switch and the sixth switch and then turn on the first switch, and may turn off the first switch and the fourth switch and then turn on the second switch and the third switch, thereby cancelling the offset of the first unity gain amplifier and the offset of the second unity gain amplifier.

The controller may include a comparator to compare a voltage of the first floating diffusion node and a voltage of the second floating diffusion node.

The feedback unit may feed back the difference voltage to the second floating diffusion node when the voltage of the first floating diffusion node is greater than the voltage of the second floating diffusion node based on the comparison result, and may feed back the difference voltage to the first floating diffusion node when the voltage of the first floating diffusion node is less than or equal to the voltage of the second floating diffusion node based on the comparison result.

The controller may further include a feedback controller to determine that a saturation probability of the first floating diffusion node and the second floating diffusion node is great in an interval in which at least one of the voltage of the first floating diffusion node and the voltage of the second floating diffusion node is less than or equal to a predetermined reference voltage, and to control the feedback unit to perform the feedback.

The feedback controller may determine that the saturation probability of the first floating diffusion node and the second floating diffusion node is small in an interval in which the voltage of the first floating diffusion node and the voltage of the second floating diffusion node are greater than the predetermined reference voltage, and may control the feedback unit not to perform the feedback.

The controller may include a resetting unit to reset, to a reference voltage, a remaining floating diffusion node to which the difference voltage is not fed back between the first floating diffusion node and the second floating diffusion node.

A first phase and a second phase may have a phase difference of 180 degrees with respect to each other.

The foregoing and/or other aspects are achieved by providing a depth sensing method of a depth sensing apparatus, including calculating a difference voltage between a first floating diffusion node and a second floating diffusion node, based on a voltage of a photodiode stored in the first floating diffusion node in a first phase interval and a voltage of the photodiode stored in the second floating diffusion node in a second phase interval, using a sub-integration period, feeding back the difference voltage to one of the first floating diffusion node and the second floating diffusion node, and calculating a depth value of a pixel based on difference voltages accumulated during an integration period including sub-integration periods.

The depth sensing method may further include measuring a voltage of the first floating diffusion node using a first unity gain amplifier, and measuring a voltage of the second floating diffusion node using a second unity gain amplifier.

The depth sensing method may further include cancelling an offset of the first unity gain amplifier and an offset of the second unity gain amplifier by controlling operation timing of a first switch connecting the first unity gain amplifier and an input end of a CDS amplifier, a second switch connecting the second unity gain amplifier and the CDS amplifier, a third switch connecting a feedback capacitor and the CDS amplifier, a fourth switch of the CDS amplifier, a fifth switch connecting an output end of the CDS amplifier and the first floating diffusion node, and a sixth switch connecting the output end of the CDS amplifier and the second floating diffusion node.

The cancelling may include turning on the first switch, the third switch, and the fourth switch when the voltage of the first floating diffusion node is greater than the voltage of the second floating diffusion node, turning off the first switch and the fourth switch and then turning on the second switch, turning off the second switch and the third switch and then turning on the fourth switch, the fifth switch, and the sixth switch, to thereby reset the voltage of the first floating diffusion node and the voltage of the second floating diffusion node to a reference voltage, turning off the fifth switch and the sixth switch and then turning on the second switch, and turning off the second switch and the fourth switch and then turning on the first switch and the third switch, thereby cancelling the offset of the first unity gain amplifier and the offset of the second unity gain amplifier.

The cancelling may include turning on the second switch, the third switch, and the fourth switch when the voltage of the first floating diffusion node is less than or equal to the voltage of the second floating diffusion node, turning off the second switch and the fourth switch and then turning on the first switch, turning off the first switch and the third switch and then turning on the fourth switch, the fifth switch, and the sixth switch to thereby reset the voltage of the first floating diffusion node and the voltage of the second floating diffusion node to a reference voltage, turning off the fifth switch and the sixth switch and then turning on the first switch, and turning off the first switch and the fourth switch and then turning on the second switch and the third switch, thereby cancelling the offset of the first unity gain amplifier and the offset of the second unity gain amplifier.

The depth sensing method may further include comparing a voltage of the first floating diffusion node and a voltage of the second floating diffusion node.

The feeding back may include feeding back the difference voltage to the second floating diffusion node when the voltage of the first floating diffusion node is greater than the voltage of the second floating diffusion node based on the comparison result, and feeding back the difference voltage to the first floating diffusion node when the voltage of the first floating diffusion node is less than or equal to the voltage of the second floating diffusion node based on the comparison result.

The depth sensing method may further include controlling the feedback to be performed by determining that a saturation probability of the first floating diffusion node and the second floating diffusion node is great in an interval in which at least one of the voltage of the first floating diffusion node and the voltage of the second floating diffusion node is less than or equal to a predetermined reference voltage.

The controlling may include controlling the feedback not to be performed by determining that the saturation probability of the first floating diffusion node and the second floating diffusion node is small in an interval in which the voltage of the first floating diffusion node and the voltage of the second floating diffusion node are greater than the predetermined reference voltage.

The depth sensing method may further include resetting, to a reference voltage, a remaining floating diffusion node to which the difference voltage is not fed back between the first floating diffusion node and the second floating diffusion node.

Additional aspects of embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of embodiments, taken in conjunction with the accompanying drawings of which:

FIG. 3 illustrates a depth sensing apparatus according to an embodiment;

DETAILED DESCRIPTION

Figure 1:
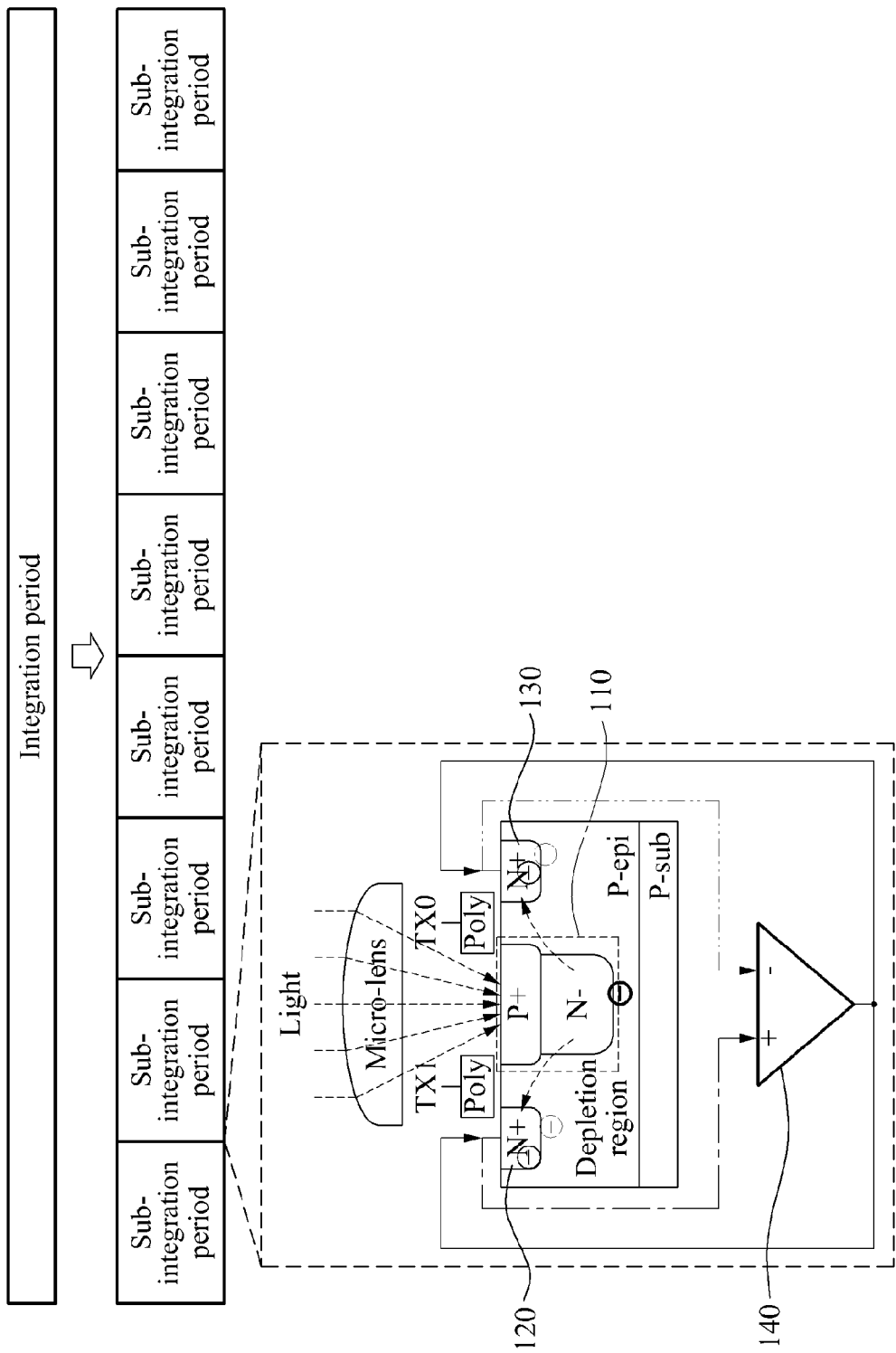
FIG. 1 illustrates a depth sensing apparatus according to an embodiment.

Reference will now be made in detail to embodiments, examples of which are illustrated in the accompanying drawings, wherein like reference numerals refer to like elements throughout. Embodiments are described below to explain the present disclosure by referring to the figures.

FIG. 1 illustrates an architecture of a depth sensing apparatus according to an embodiment.

The sensing architecture as shown in FIG. 1 may be generally divided into three elements. First, a total integration time may be divided into sub-integration times. When background light is strong, such as outdoor light, for example, a large amount of charge is generated during an integration time and thus, avoiding saturation may be difficult. However, in the case of appropriately selecting a sub-integration time, a time period for accumulating charge is shorter and thus, saturation may be avoided. Second, when a sub-integration ends, a difference may be generated by reading a charge of floating diffusion (FD) nodes on both sides that are used as storage nodes. The same amount of charge due to background light is accumulated in both nodes. Accordingly, when causing a difference between both nodes, it is possible to eliminate common-mode charge. Third, a difference value is fed back to FD nodes and is stored therein. To separately store the difference value, a frame memory capable of storing all of the pixel values may significantly increase a pixel area or a sensor area. Accordingly, in order to configure a storage function using a small area, the difference value is fed back to the FD nodes and stored therein.

Referring to FIG. 1, the depth sensing apparatus may calculate a depth value of a pixel based on an amount of charge accumulated in a floating diffusion node 120 and a floating diffusion node 130 using a sub-integration period. An integration period may include a plurality of sub-integration periods. For example, when a single sub-integration period is terminated, an amount of charge stored in the floating diffusion node 120 and the floating diffusion node 130 may be calculated. The stored amount of charge may be measured as a voltage. The floating diffusion node 120 may store an amount of charge supplied to a photodiode 110 according to a signal applied to TX1. The floating diffusion node 130 may store an amount of charge supplied to the photodiode 110 according to a signal applied to TX0. Although a photodiode is shown in FIG. 1, the disclosure is not limited to the above-described embodiment. Other light sensing devices, such as a photogate or charge coupled device (CCD), for example, may be used in place of the photodiode.

A comparator 140 may compare a voltage of the floating diffusion node 120 and a voltage of the floating diffusion node 130, and may feed back a difference voltage therebetween to one of the floating diffusion node 120 and the floating diffusion node 130 based on the comparison result.

For example, when the voltage of the floating diffusion node 120 is greater than the voltage of the floating diffusion node 130, the comparator 140 may feed back the difference voltage to the floating diffusion node 130. In the example of FIG. 1, charge stored in the floating diffusion node 120 and the floating diffusion node 130 may have a negative voltage. The voltage of the floating diffusion node 120 being greater than the voltage of the floating diffusion node 130 is based on a sign of the voltage and thus, an absolute value of the voltage of the floating diffusion node 120 may be less than an absolute value of the voltage of the floating diffusion node 130. For example, the voltage of the floating diffusion node 120 may be −2V, and the voltage of the floating diffusion node 130 may be −3V.

As an example, when the voltage of the floating diffusion node 120 and the voltage of the floating diffusion node 130 have a positive voltage, and when the voltage of the floating diffusion node 120 is greater than the voltage of the floating diffusion node 130, the comparator 140 may feed back the difference voltage to the floating diffusion node 120.

Figure 2A:
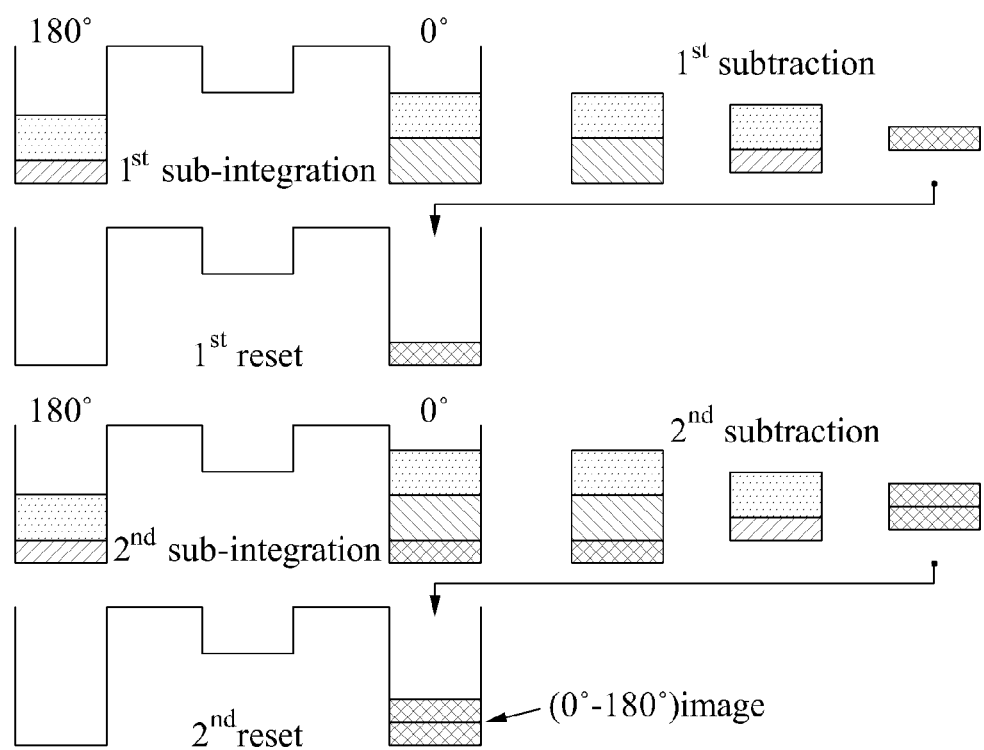
FIGS. 2A and 2B illustrate a process of a depth sensing apparatus to accumulate a difference voltage according to an embodiment.
Figure 2B:
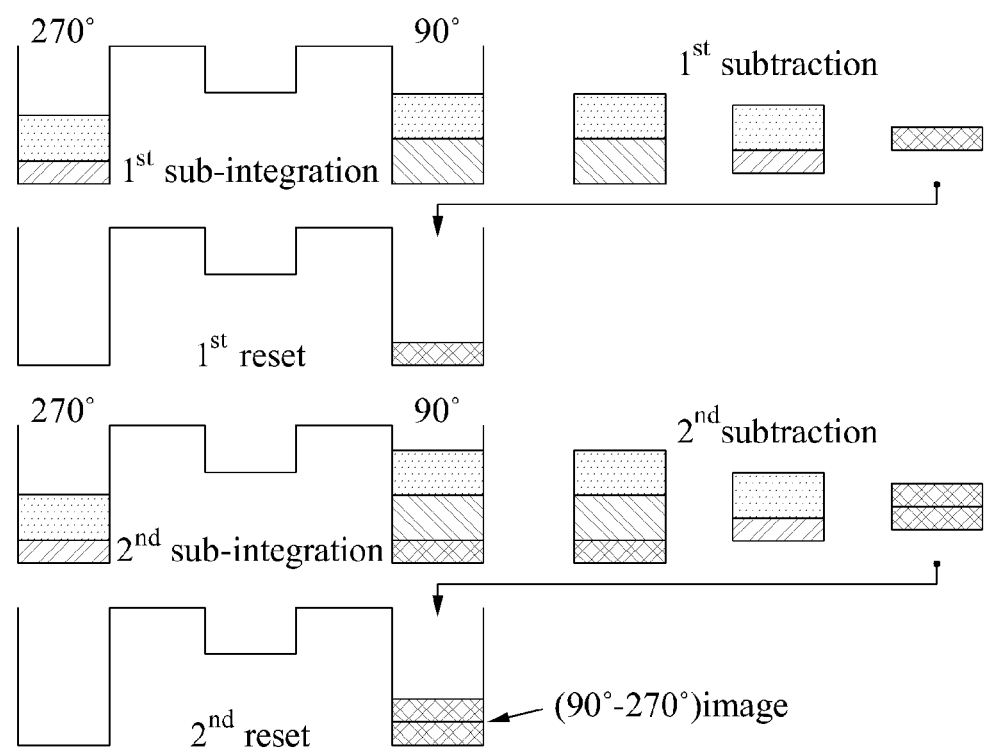

FIGS. 2A and 2B illustrate a process of a depth sensing apparatus to accumulate a difference voltage according to an embodiment.

Referring to FIG. 2A, a first difference voltage may be calculated in a first sub-integration period through $1^{st}$ subtraction. When a signal having the same phase, such as zero degrees, for example, as light emitted toward an object is applied to TX0 of FIG. 1, charge may be stored in the floating diffusion node 130. When a signal having an opposite phase, such as 180 degrees, for example, to the emitted light is applied to TX1, charge may be stored in the floating diffusion node 120. A difference may occur between an amount of charge stored in the floating diffusion node 120 and an amount of charge stored in the floating diffusion node 130 based on a distance between the depth sensing apparatus and the object. An amount of charge stored in the floating diffusion node 130 is greater than an amount of charge stored in the floating diffusion node 120 and thus, the first difference voltage may be fed back to the floating diffusion node 130. A second difference voltage calculated in a second sub-integration period through $2^{nd}$ subtraction may also be fed back to the floating diffusion node 130.

Referring to FIG. 2B, when a signal having a phase difference of 90 degrees with light emitted toward an object is applied to TX0 of FIG. 1, charge may be stored in the floating diffusion node 130. When a signal having an opposite phase of 270 degrees to the emitted light is applied to TX1, charge may be stored in the floating diffusion node 120. An amount of charge stored in the floating diffusion node 130 is greater than an amount of charge stored in the floating diffusion node 120 and thus, the first difference voltage may be fed back to the floating diffusion node 130. The second difference voltage calculated in the second sub-integration period through $2^{nd}$ subtraction may also be fed back to the floating diffusion node 130. As an example, when an amount of charge stored in the floating diffusion node 120 is greater than an amount of charge stored in the floating diffusion node 130, the first difference voltage may be fed back to the floating diffusion node 120.

FIG. 3 illustrates a depth sensing apparatus according to an embodiment.

Referring to FIG. 3, the depth sensing apparatus may include a calculator 340, a feedback unit 350, and a controller 360.

The depth sensing apparatus may include a pixel circuit to receive light, such as infrared (IR) light, for example, and generate charge, and a column circuit to read a pixel value of each pixel circuit and control a pixel.

The calculator 340 may calculate a difference voltage between a first floating diffusion node 320 and a second floating diffusion node 330 based on a sub-integration period. For example, the calculator 340 may calculate the difference voltage based on a voltage of a photodiode 310 stored in the first floating diffusion node 320 in a first phase interval and a voltage of the photodiode 310 stored in the second floating diffusion node 330 in a second phase interval.

The first phase interval indicates an interval in which a signal of a first phase is applied to TX0 of FIG. 1 and the first floating diffusion node 320 stores charge provided from the photodiode 310.

The second phase interval indicates an interval in which a signal of a second phase is applied to TX1 of FIG. 1 and the second floating diffusion node 330 stores charge provided from the photodiode 310.

For example, the first phase and the second phase may have a phase difference of 180 degrees with respect to each other. When the first phase has zero degrees, the second phase may have 180 degrees. When the first phase has 90 degrees, the second phase may have 270 degrees.

The feedback unit 350 may feed back the calculated difference voltage to one of the first floating diffusion node 320 and the second floating diffusion node 330. For example, when a voltage of the first floating diffusion node 320 is greater than a voltage of the second floating diffusion node 330, the feedback unit 350 may feed back the calculated difference voltage to the voltage of the second floating diffusion node 330. As an example, when the voltage of the first floating diffusion node 320 is less than or equal to the voltage of the second floating diffusion node 330, the feedback unit 350 may feed back the calculated difference voltage to the first floating diffusion node 320. Here, it is assumed that both the first floating diffusion node 320 and the second floating diffusion node 330 have a negative voltage.

As an example, when both the first floating diffusion node 320 and the second floating diffusion node 330 have a positive voltage, and when the voltage of the first floating diffusion node 320 is greater than the voltage of the second floating diffusion node 330, the feedback unit 350 may feed back the calculated difference voltage to the first floating diffusion node 320. Further, when the voltage of the first floating diffusion node 320 is less than or equal to the voltage of the second floating diffusion node 330, the feedback unit 350 may feed back the calculated difference voltage to the second floating diffusion node 330.

Because a floating diffusion node to which the calculated difference voltage is to be fed back is determined by comparing the voltage of the first floating diffusion node 320 and the voltage of the second floating diffusion node 330, the floating diffusion node may not be saturated. Also, the floating diffusion node may not be saturated by using a sub-integration period. For example, the sub-integration period may be preset based on the full well capacity of the floating diffusion node indicating a full charge amount. The sub-integration period may be set to have a fixed period of time, and the period of time may be adaptively adjusted based on an amount of charge to be stored in the floating diffusion node. An effect of background light may be eliminated using the difference voltage.

The controller 360 may calculate a depth value of a pixel based on difference voltages accumulated during an integration period including sub-integration periods. The controller 360 may calculate the depth value of the pixel by accumulating difference voltages fed back during the integration period.

As an example, the controller 360 may control timing for emitting light, for example, IR ray, for active depth value sensing. For example, the controller 360 may perform a functionality of a light emitting diode (LED) driver. The controller 360 may perform a functionality of controlling a pixel circuit and a column circuit, such as reading charge of a floating diffusion node included in a pixel.

According to an embodiment, the depth sensing apparatus may eliminate distortion of a depth value occurring due to background light and may prevent pixel saturation through an operation of the calculator 340 and the feedback unit 350. Accordingly, accuracy of the depth value calculated by the controller 360 may be significantly enhanced.

In general, a method of calculating a depth using an active depth camera of a time of flight (TOF) scheme may include a 4-phase scheme and a 2-phase scheme. Both the 4-phase scheme and the 2-phase scheme may eliminate the background light during a calculation process.

The following description will be made based on an example in which a single photodiode 310 and two floating diffusion nodes, such as the first floating diffusion node 320 and the second floating diffusion node 330, for example, are included within a single pixel of the depth sensing apparatus.

In the case of the 4-phase scheme, a voltage difference between zero degrees and 180 degrees may be obtained through a first measurement, and a voltage difference between 90 degrees and 270 degrees may be obtained through a second measurement, by employing transistors TX0 and TX1 to perform an electric shutter functionality with respect to two floating diffusion nodes, such as the first floating diffusion node 320 and the second floating diffusion node 330, respectively, for example.

The controller 350 may eliminate the background light using a difference between the above measured voltage values and may calculate a depth value.

Because the same photodiode 310 corresponds to a single pixel, an amount of charge occurring due to the background light may be the same even though signals having the difference between zero degrees and 180 degrees are concentrated at the first floating diffusion node 320 and second floating diffusion node 330, respectively. Accordingly, charge occurring due to the background light may be eliminated by calculating the difference between an amount of charge stored in the first floating diffusion node 320 and an amount of charge stored in the second floating diffusion node 330.

When the voltage difference between zero degrees and 180 degrees and the voltage difference between 90 degrees and 270 degrees are obtained, an amount of charge occurring due to the background light may disappear and a TOF may be calculated from a remaining amount of charge.

In the case of the 2-phase scheme, a voltage may be measured to generate a voltage difference between zero degrees and 180 degrees through the first measurement and a voltage using a charge value generated by only an IR LED without emitting IR may be measured through the second measurement.

When the difference between the first measurement and the second measurement is used, a TOF between zero degrees and 180 degrees in which the background light is eliminated may be calculated.

Figure 4:
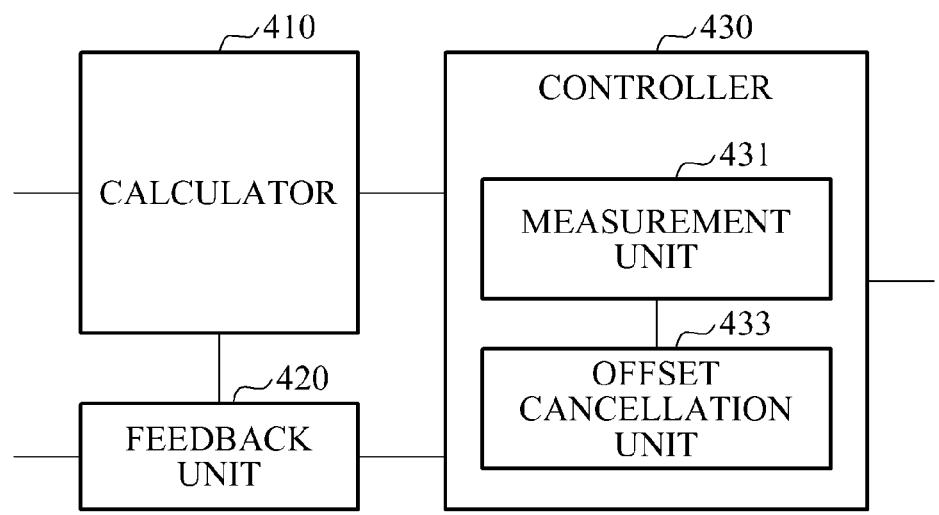
FIG. 4 through FIG. 6 illustrate a depth sensing apparatus according to embodiments.
Figure 5:
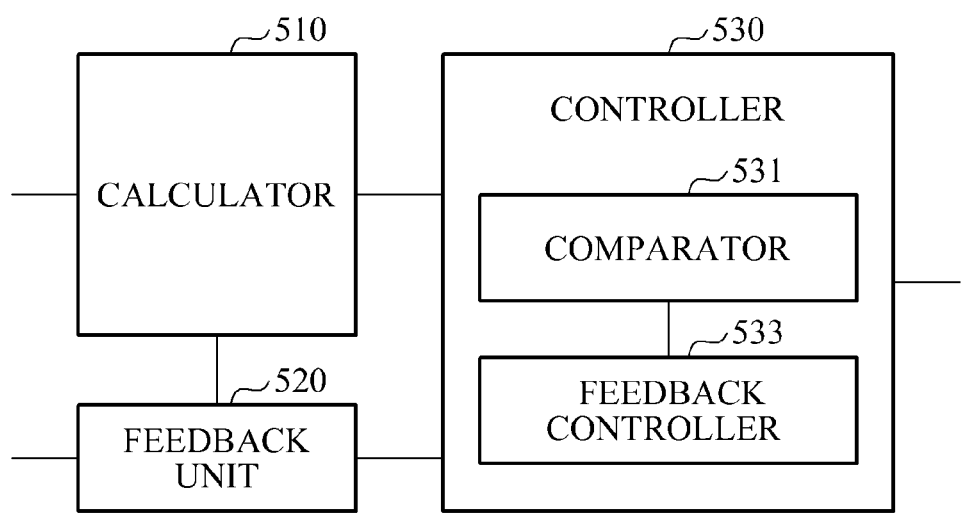
Figure 6:
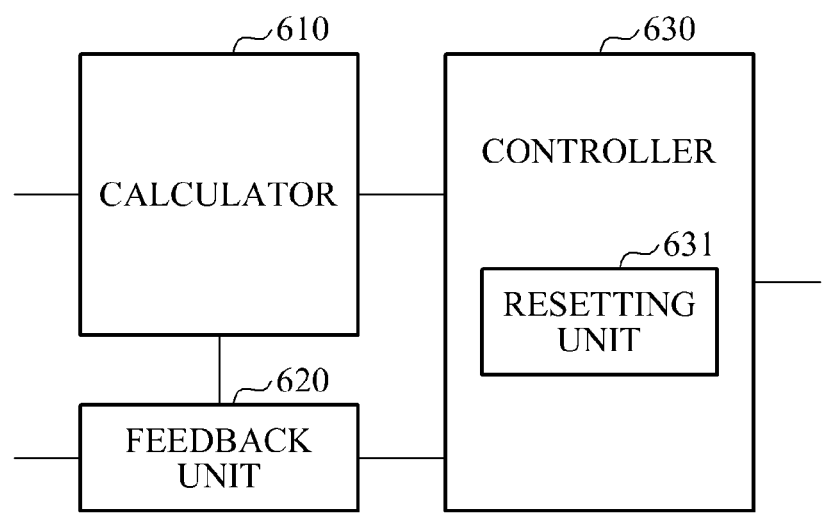

FIG. 4 through FIG. 6 illustrate a depth sensing apparatus according to embodiments.

Referring to FIG. 4, the depth sensing apparatus may include a calculator 410, a feedback unit 420, and a controller 430.

The calculator 410 may calculate a difference voltage between a first floating diffusion node and a second floating diffusion node based on a sub-integration period. For example, the calculator 410 may calculate the difference voltage based on a voltage of a photodiode stored in the first floating diffusion node in a first phase interval and a voltage of the photodiode stored in the second floating diffusion node in a second phase interval.

The feedback unit 420 may feed back the calculated difference voltage to one of the first floating diffusion node and the second floating diffusion node. For example, when a voltage of the first floating diffusion node is greater than a voltage of the second floating diffusion node, the feedback unit 420 may feed back the calculated difference voltage to the voltage of the second floating diffusion node. As an example, when the voltage of the first floating diffusion node is less than or equal to the voltage of the second floating diffusion node, the feedback unit 420 may feed back the calculated difference voltage to the first floating diffusion node. Here, it is assumed that both the first floating diffusion node and the second floating diffusion node have a negative voltage.

As an example, when both the first floating diffusion node and the second floating diffusion node have a positive voltage, and when the voltage of the first floating diffusion node is greater than the voltage of the second floating diffusion node, the feedback unit 420 may feed back the calculated difference voltage to the first floating diffusion node. Further, when the voltage of the first floating diffusion node is less than or equal to the voltage of the second floating diffusion node, the feedback unit 420 may feed back the calculated difference voltage to the second floating diffusion node.

The controller 430 may calculate a depth value of a pixel based on difference voltages accumulated during an integration period including sub-integration periods. The controller 430 may calculate the depth value of the pixel by accumulating difference voltages fed back during the integration period.

The controller 430 may include a measurement unit 431 and an offset cancellation unit 433.

For example, the measurement unit 431 may measure the voltage of the first floating diffusion node using a first unity gain amplifier. The measurement unit 431 may measure the voltage of the second floating diffusion node using a second unity gain amplifier.

A source follower may be used to read a voltage of a floating diffusion node. The source follower may be configured in a small size and may be used due to its excellent buffering capability. A gain of the source follower is generally "0.7" to "0.8", which is less than "1". Accordingly, when the difference voltage is accumulated and used based on a sub-integration period in an integration period, gain values are duplicated and multiplied. For example, when the difference voltage is $V_{diff}$, the difference voltage may be expressed by the following Equation 1:

$$V_{diff} = V_{ref} + [(V_{ph0} - V_{ph180}) + (V_{off0} - V_{off1})] \cdot \frac{1 - G_{SF}^n}{1 - G_{SF}} \quad \text{[Equation 1]}$$

In Equation 1, $V_{ph0}$ denotes a value of FD0 that is a floating diffusion node on the side of TX0, $V_{ph180}$ denotes a value of FD1 that is a floating diffusion node on the side of TX1, $V_{off0, 1}$ denotes an offset of both source followers, and $G_{SF}$ denotes a gain.

When $G_{SF}$ is less than "1", a value of $V_{diff}$ may converge on a predetermined value according to an increase in "n". Accordingly, an effect of difference voltage accumulated based on the sub-integration period may disappear. By employing a unity gain amplifier instead of using a source follower, it is possible to maintain the effect of difference voltage accumulated based on the sub-integration period.

Offsets may occur in each of the first unity gain amplifier and the second unity gain amplifier, and may have different values. An offset may be used for a calculation process of the calculator 410 and thus, may need to be cancelled for the accuracy of calculation.

The offset cancellation unit 433 may cancel an offset of the first unity gain amplifier and an offset of the second unity gain amplifier. For example, the offset cancellation unit 433 may cancel the offset of the first unity gain amplifier and the offset of the second unity gain amplifier by controlling operation timing of a first switch connecting the first unity gain amplifier and an input end of a correlated double sampling (CDS) amplifier, a second switch connecting the second unity gain amplifier and the CDS amplifier, a third switch connecting a feedback capacitor and the CDS amplifier, a fourth switch of the CDS amplifier, a fifth switch connecting an output end of the CDS amplifier and the first floating diffusion node, and a sixth switch connecting the output end of the CDS amplifier and the second floating diffusion node. A position and a configuration of each switch will be further described with reference to FIG. 9.

When the voltage of the first floating diffusion node is greater than the voltage of the second floating diffusion node, the offset cancellation unit 433 may turn on the first switch, the third switch, and the fourth switch. Next, the offset cancellation unit 433 may turn off the first switch and the fourth switch and then turn on the second switch. Next, the offset cancellation unit 433 may turn off the second switch and the third switch and then turn on the fourth switch, the fifth switch, and the sixth switch, to thereby reset the voltage of the first floating diffusion node and the voltage of the second floating diffusion node to a reference voltage. Next, the offset cancellation unit 433 may turn off the fifth switch and the sixth switch and then turn on the second switch. Next, the offset cancellation unit 433 may turn off the second switch and the fourth switch and then turn on the first switch and the third switch, thereby cancelling the offset of the first unity gain amplifier and the offset of the second unity gain amplifier.

Operation timing of each switch will be further described with reference to FIG. 10.

When the voltage of the first floating diffusion node is less than or equal to the voltage of the second floating diffusion node, the offset cancellation unit 433 may turn on the second switch, the third switch, and the fourth switch. Next, the offset cancellation unit 433 may turn off the second switch and the fourth switch and then turn on the first switch. Next, the offset cancellation unit 433 may turn off the first switch and the third switch and then turn on the fourth switch, the fifth switch, and the sixth switch to thereby reset the voltage of the first floating diffusion node and the voltage of the second floating diffusion node to a reference voltage. Next, the offset cancellation unit 433 may turn off the fifth switch and the sixth switch and then turn on the first switch. Next, the offset cancellation unit 433 may turn off the first switch and the fourth switch and then turn on the second switch and the third switch, thereby cancelling the offset of the first unity gain amplifier and the offset of the second unity gain amplifier.

Referring to FIG. 5, the depth sensing apparatus according to an embodiment may include a calculator 510, a feedback unit 520, and a controller 530.

The calculator 510 may calculate a difference voltage between a first floating diffusion node and a second floating diffusion node based on a sub-integration period. For example, the calculator 510 may calculate the difference voltage based on a voltage of a photodiode stored in the first floating diffusion node in a first phase interval and a voltage of the photodiode stored in the second floating diffusion node in a second phase interval.

The feedback unit 520 may feed back the calculated difference voltage to one of the first floating diffusion node and the second floating diffusion node. For example, when a voltage of the first floating diffusion node is greater than a voltage of the second floating diffusion node, the feedback unit 520 may feed back the calculated difference voltage to the voltage of the second floating diffusion node. As an example, when the voltage of the first floating diffusion node is less than or equal to the voltage of the second floating diffusion node, the feedback unit 520 may feed back the calculated difference voltage to the first floating diffusion node. Here, it is assumed that both the first floating diffusion node and the second floating diffusion node have a negative voltage.

As an example, when both the first floating diffusion node and the second floating diffusion node have a positive voltage, and when the voltage of the first floating diffusion node is greater than the voltage of the second floating diffusion node, the feedback unit 520 may feed back the calculated difference voltage to the first floating diffusion node. Further, when the voltage of the first floating diffusion node is less than or equal to the voltage of the second floating diffusion node, the feedback unit 520 may feed back the calculated difference voltage to the second floating diffusion node.

The controller 530 may calculate a depth value of a pixel based on difference voltages accumulated during an integration period including sub-integration periods. The controller 530 may calculate the depth value of the pixel by accumulating difference voltages fed back during the integration period.

The controller 530 may include a comparator 531 and a feedback controller 533.

For example, the comparator 531 may compare the voltage of the first floating diffusion node and the voltage of the second floating diffusion node.

For example, when the voltage of the first floating diffusion node is greater than the voltage of the second floating diffusion node based on the comparison result of the comparator 531, the feedback unit 520 may feed back the difference voltage to the second floating diffusion node. Also, when the voltage of the first floating diffusion node is less than or equal to the voltage of the second floating diffusion node based on the comparison result of the comparator 531, the feedback unit 520 may feed back the calculated difference voltage to the first floating diffusion node.

As an example, when the voltage of the first floating diffusion node is greater than the voltage of the second floating diffusion node based on the comparison result of the comparator 531, the feedback unit 520 may feed back the difference voltage to the first floating diffusion node. Also, when the voltage of the first floating diffusion node is less than or equal to the voltage of the second floating diffusion node based on the comparison result of the comparator 531, the feedback unit 520 may feed back the calculated difference voltage to the second floating diffusion node.

For example, in an interval in which at least one of the voltage of the first floating diffusion node and the voltage of the second floating diffusion node is less than or equal to a predetermined reference voltage, the feedback controller 533 may determine that a saturation probability of the first floating diffusion node and the second floating diffusion node is great. The feedback controller 533 may activate the feedback unit 520 to perform the feedback. In a remaining interval, the feedback controller 533 may inactivate the feedback unit 520.

When a length of a sub-integration period is determined based on whether to feed back the difference voltage, the length of the sub-integration period may be determined based on the decision of the feedback controller 533.

In an interval in which the voltage of the first floating diffusion node and the voltage of the second floating diffusion node are greater than the predetermined reference voltage, the feedback controller 533 may determine that the saturation probability of the first floating diffusion node and the second floating diffusion node is small. The feedback controller 533 may inactivate the feedback unit 520 in order not to perform the feedback. In an interval in which the feedback unit 520 is inactivated, charge may be continuously stored in the first floating diffusion node and the second floating diffusion node.

Based on background light and a peripheral environment of the depth sensing apparatus, the voltage of the first floating diffusion node and the voltage of the second floating diffusion node may vary for each pixel. Accordingly, the length of the sub-integration period may be adaptively adjusted for each pixel.

Also, during a feedback process, a reset transistor may be used. kTC noise may be introduced due to the reset transistor. An effect of kTC noise may be minimized by adaptively adjusting the number of feedbacks.

Referring to FIG. 6, the depth sensing apparatus according to an embodiment may include a calculator 610, a feedback unit 620, and a controller 630.

The calculator 610 may calculate a difference voltage between a first floating diffusion node and a second floating diffusion node based on a sub-integration period. For example, the calculator 610 may calculate the difference voltage based on a voltage of a photodiode stored in the first floating diffusion node in a first phase interval and a voltage of the photodiode stored in the second floating diffusion node in a second phase interval.

The feedback unit 620 may feed back the calculated difference voltage to one of the first floating diffusion node and the second floating diffusion node. For example, when a voltage of the first floating diffusion node is greater than a voltage of the second floating diffusion node, the feedback unit 620 may feed back the calculated difference voltage to the voltage of the second floating diffusion node. As an example, when the voltage of the first floating diffusion node is less than or equal to the voltage of the second floating diffusion node, the feedback unit 620 may feed back the calculated difference voltage to the first floating diffusion node. Here, it is assumed that both the first floating diffusion node and the second floating diffusion node have a negative voltage.

As an example, when both the first floating diffusion node and the second floating diffusion node have a positive voltage, and when the voltage of the first floating diffusion node is greater than the voltage of the second floating diffusion node, the feedback unit 620 may feed back the calculated difference voltage to the first floating diffusion node. Further, when the voltage of the first floating diffusion node is less than or equal to the voltage of the second floating diffusion node, the feedback unit 620 may feed back the calculated difference voltage to the second floating diffusion node.

The controller 630 may calculate a depth value of a pixel based on difference voltages accumulated during an integration period including sub-integration periods. The controller 630 may calculate the depth value of the pixel by accumulating difference voltages fed back during the integration period.

The controller 630 may include a resetting unit 631.

For example, the resetting unit 631 may reset, to a reference voltage, a remaining floating diffusion node to which the difference voltage is not fed back between the first floating diffusion node and the second floating diffusion node. A floating diffusion node may be reset to the reference value in order to initialize a reference of voltage based on the sub-integration period.

Figure 7:
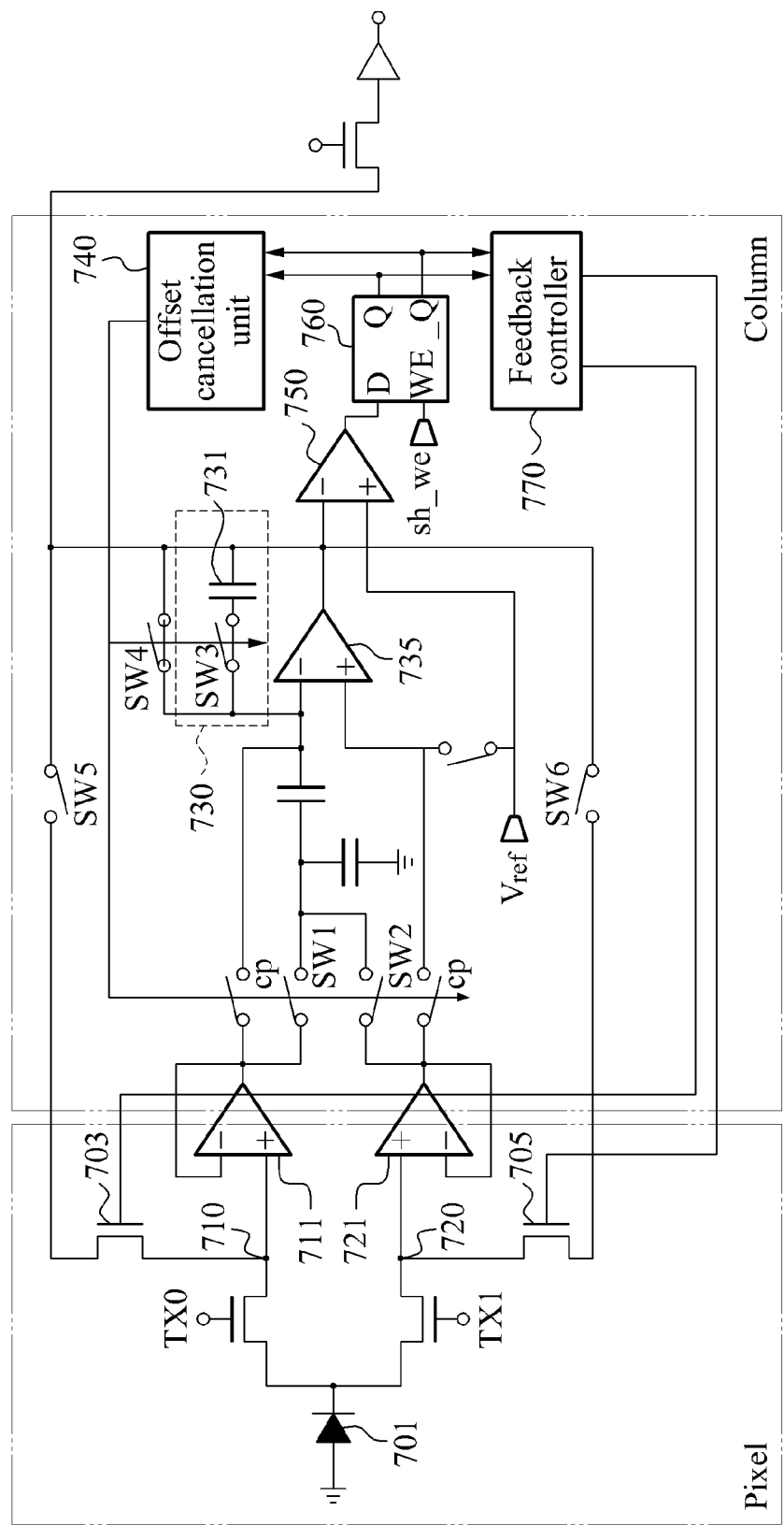
FIG. 7 illustrates a circuit configuration of a depth sensing apparatus according to an embodiment.

FIG. 7 illustrates a circuit configuration of a depth sensing apparatus according to an embodiment.

A circuit of FIG. 7 is simplified for ease of description and thus, may not include all of the following description in detail. Accordingly, a configuration of a circuit that is added and modified will be further described with reference to FIGS. 8, 9, 12, and 13.

Referring to FIG. 7, charge provided from a photodiode 701 may be stored in a first floating diffusion node 710 based on an ON/OFF state of TX0. Also, charge provided from the photodiode 701 may be stored in a second floating diffusion node 720 based on an ON/OFF state of TX1.

The first floating diffusion node 710 may be reset in response to an operation of a reset transistor 703, and the second floating diffusion node 720 may be reset in response to an operation of a reset transistor 705.

A unity gain amplifier having a gain of "1" may be used. A first unity gain amplifier 711 and a second unity gain amplifier 721 may have a structure in which a negative input end and an output end are connected to each other and thus, may perform an operation of unity gain.

A temporary storage unit 730 of a correlated double sampling (CDS) amplifier 735 may be used to cancel an offset of the first unity gain amplifier 711 and an offset of the second unity gain amplifier 721. A comparator 750 may compare a voltage of the first floating diffusion node 710 and a reference voltage, and may compare a voltage of the second floating diffusion node 720 and the reference voltage. An offset cancellation unit 740 may control an operation timing of switches SW1, SW2, SW3, SW4, SW5, and SW6 in order to cancel the offset of the first unity gain amplifier 711 and the offset of the second unity gain amplifier 721.

A feedback controller 770 may control an operation of the reset transistors 703 and 705 according to control by a processing unit 760.

Figure 8:
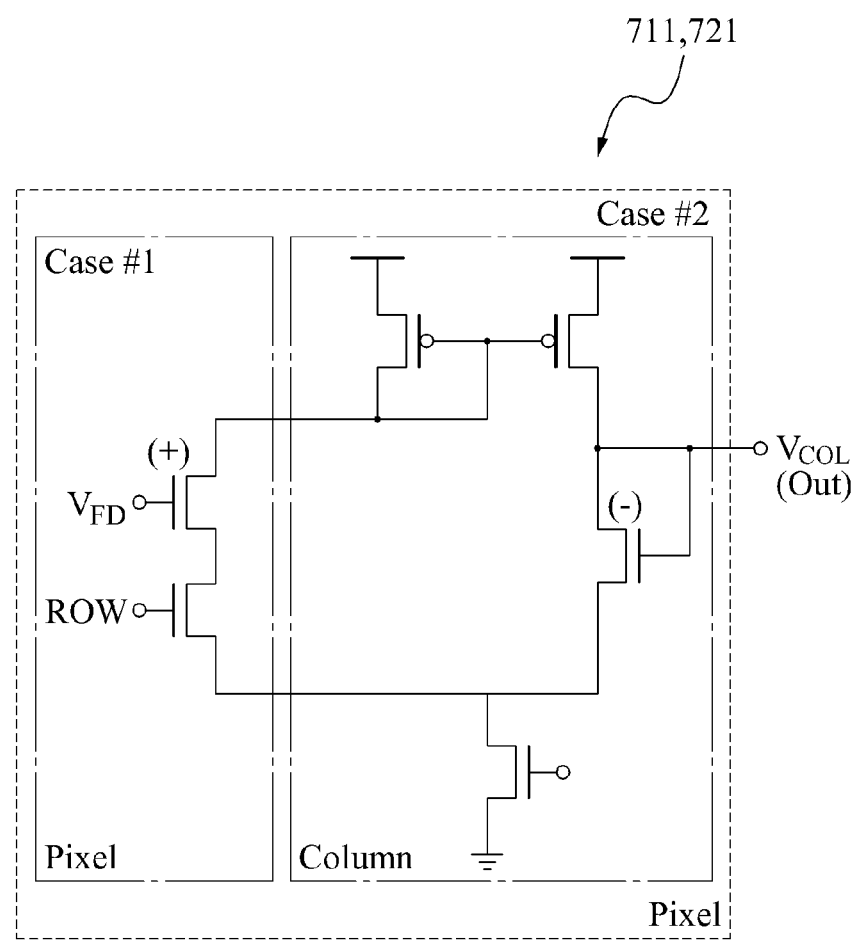
FIG. 8 illustrates a circuit configuration of a unity gain amplifier of a depth sensing apparatus according to an embodiment.

FIG. 8 illustrates a circuit configuration of a unity gain amplifier at a depth sensing apparatus according to an embodiment.

Referring to FIG. 8, the unity gain amplifier, for example, the first unity gain amplifier 711 and the second unity gain amplifier 721, is an amplifier having a gain of "1" and an amplifier having a structure different from the proposed embodiment may also be used. Here, the unity gain amplifier, for example, the first unity gain amplifier 711 and the second unity gain amplifier 721, is provided in a feedback structure that connects an output end and a negative input end for a unity gain.

As shown in case #1 of FIG. 8, in the case of the unity gain amplifier, for example, the first unity gain amplifier 711 and the second unity gain amplifier 721, only the positive input end may be included in a pixel circuit and a remaining configuration may be positioned within a column circuit. As shown in case #2, all of the circuits of the unity gain amplifier, for example, the first unity gain amplifier 711 and the second unity gain amplifier 721, may be positioned with the pixel circuit.

Figure 9:
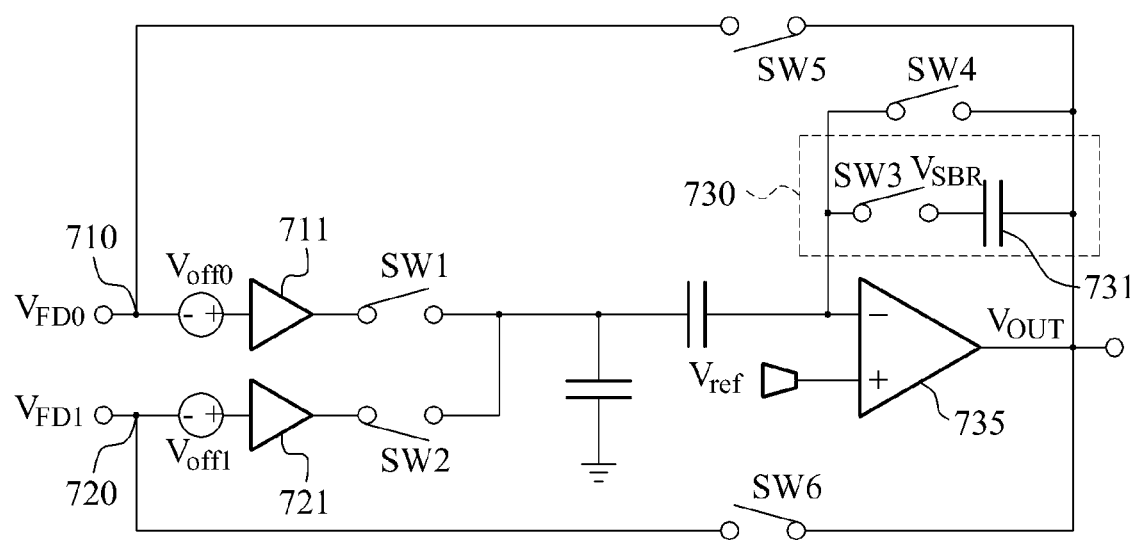
FIG. 9 illustrates a circuit of a depth sensing apparatus to cancel an offset according to an embodiment.

FIG. 9 illustrates a circuit of a depth sensing apparatus to cancel an offset according to an embodiment.

Referring to FIG. 9, because the first unity gain amplifier 711 and the second unity gain amplifier 721 are positioned at both sides, respectively, an offset difference may occur. The temporary storage unit 730 may be positioned at a feedback end of the CDS amplifier 735 in order to cancel the offsets $V_{off0}$ and $V_{off1}$. The temporary storage unit 730 may include a feedback capacitor 731 and switch SW3.

Operation timing of switches SW1, SW2, SW3, SW4, SW5, and SW6 of FIG. 9 will be further described with reference to FIG. 10.

Figure 10:
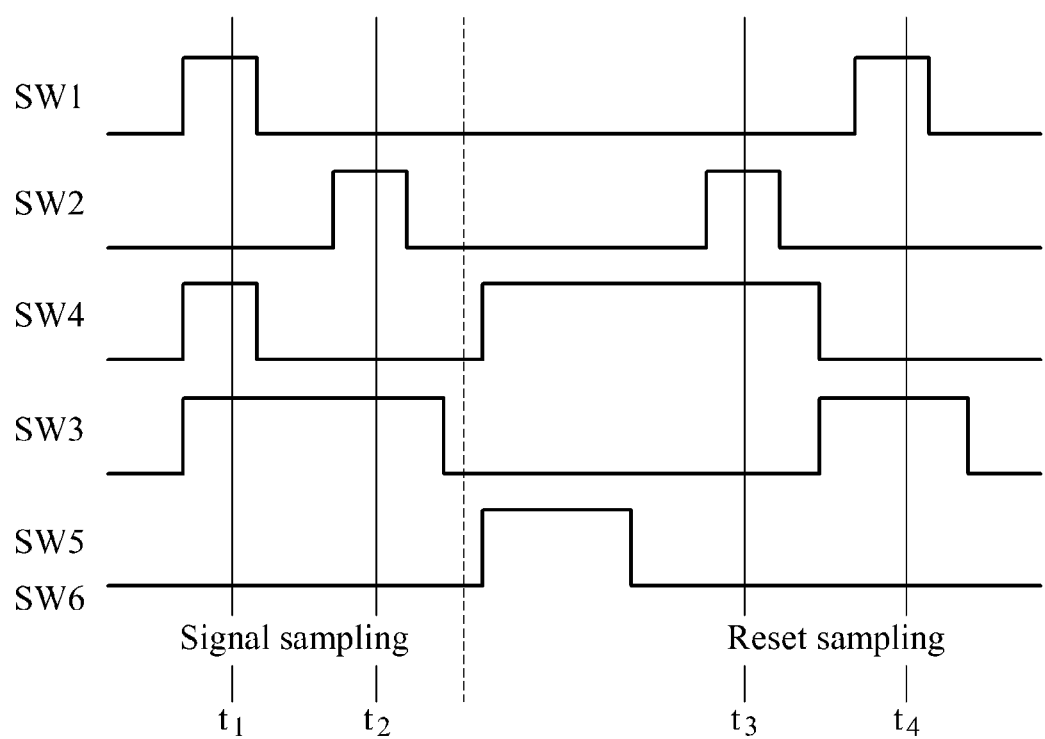
FIG. 10 illustrates signal timing in a case in which a controller of a depth sensing apparatus according to an embodiment controls switches included in a pixel or a column of FIG. 7.

FIG. 10 illustrates signal timing in a case in which a controller of a depth sensing apparatus according to an embodiment controls switches included in a pixel or a column of FIG. 7.

Referring to FIG. 10, when a sub-integration period ends, the offset cancellation unit 740 of the depth sensing apparatus may turn on SW1 and SW4, and the controller 360 of FIG. 7 may sample a voltage value of FD0 that is the first floating diffusion node 710.

Here, in $t_1$ of FIG. 10, voltage of FD0, voltage of FD1 that is the second floating diffusion node 720, $V_{SBR}$, and $V_{out}$ may be expressed by the following Equation 2:

$$V_{FD0}=V_{ph0}$$

$$V_{FD1}=V_{ph1}$$

$$V_{SBR}=V_{ref}$$

$$V_{OUT}=V_{ref} \quad \text{[Equation 2]}$$

Next, when the offset cancellation unit 740 turns off SW1 and SW4 and then turns off SW2, a difference voltage between FD0 and FD1 may be applied to the output end of the CDS amplifier 735 by a charge transfer while a voltage value of FD1 is being sampled. Here, in $t_2$ of FIG. 10, voltage of FD0, voltage of FD1, $V_{SBR}$, and $V_{out}$ may be expressed by the following Equation 3:

$$V_{FD0}=V_{ph0}$$

$$V_{FD1}=V_{ph180}$$

$$V_{SBR}=V_{ref}$$

$$V_{OUT}=V_{ref}+[(V_{ph0}+V_{off0})-(V_{ph180}+V_{off1})] \quad \text{[Equation 3]}$$

To cancel offset voltages $V_{off0}$ and $V_{off1}$, the offset cancellation unit 740 may turn on SW5 and SW6, and may compulsorily reset the voltage of FD0 and the voltage of FD1 to $V_{ref}$.

Next, the controller 360 may perform sampling again. Here, a difference with the aforementioned signal sampling is that SW1 and SW2 will be turned on in an order opposite to the aforementioned signal sampling and SW3 will be turned on after turning on SW2. Here, in $t_3$ of FIG. 10, voltage of FD0, voltage of FD1, $V_{SBR}$, and $V_{out}$ may be expressed by the following Equation 4:

$$V_{FD0}=V_{ref}$$

$$V_{FD1}=V_{ref}$$

$$V_{SBR}=V_{ref}-[(V_{ph0}+V_{off0})-(V_{ph180}+V_{off1})]$$

$$V_{OUT}=V_{ref} \quad \text{[Equation 4]}$$

When SW3 is turned on, a feedback capacitor enters in a floating node state. Here, when the offset cancellation unit 740 turns on SW4, $V_{OUT}$ becomes $V_{ref}$ and charge of the feedback capacitor is maintained. Accordingly, $V_{SBR}$ becomes the voltage as expressed by Equation 4.

Next, when the offset cancellation unit 740 turns off SW4 and then turns on SW3 and SW1, voltage of FD0, voltage of FD1, $V_{SBR}$, and $V_{out}$ in $t_4$ of FIG. 10 may be expressed by the following Equation 5:

$$V_{FD0} = V_{ref} \quad\text{[Equation 5]}$$
$$V_{FD1} = V_{ref}$$
$$V_{SBR} = V_{ref}$$
$$V_{OUT} = V_{ref} + [(V_{ph0} + V_{off0}) - (V_{ph180} + V_{off1})] +$$
$$[(V_{ref} + V_{off1}) - (V_{ref} + V_{off0})]$$
$$= V_{ref} + (V_{ph0} - V_{ph180})$$

Accordingly, the offset voltage, for example, $V_{off0}$ and $V_{off1}$, may be cancelled through the aforementioned operation.

Figure 11:
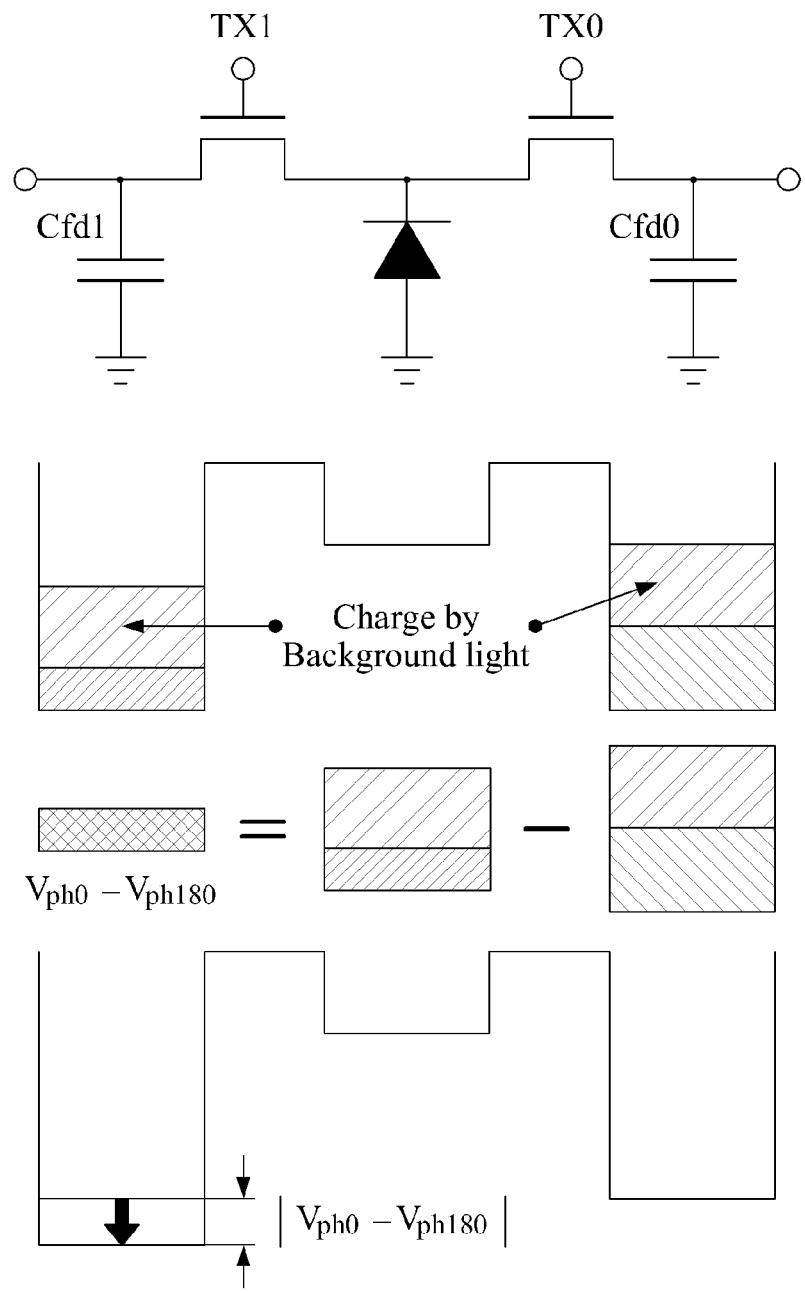
FIG. 11 illustrates a voltage level after feedback of a floating diffusion node of a depth sensing apparatus according to an embodiment.

FIG. 11 illustrates a voltage level after feedback of a floating diffusion node at a depth sensing apparatus according to an embodiment.

Referring to FIG. 11, when an amount of charge stored in FD0 is less than an amount of charge stored in FD1, a feedback value may be determined to increase a voltage of FD1 instead of lowering a voltage of FD0.

Referring to FIG. 11, when an amount of charge stored in FD0 during a sub-integration period is greater than an amount of charge stored in FD1 during the sub-integration period, it is possible to decrease a saturation probability of FD by increasing the full well capacity of FD1 by a difference voltage between FD0 and FD1. As a result, a difference between the voltage of FD1 and a pinning voltage may further increase, and voltage headroom may also increase.

Figure 12:
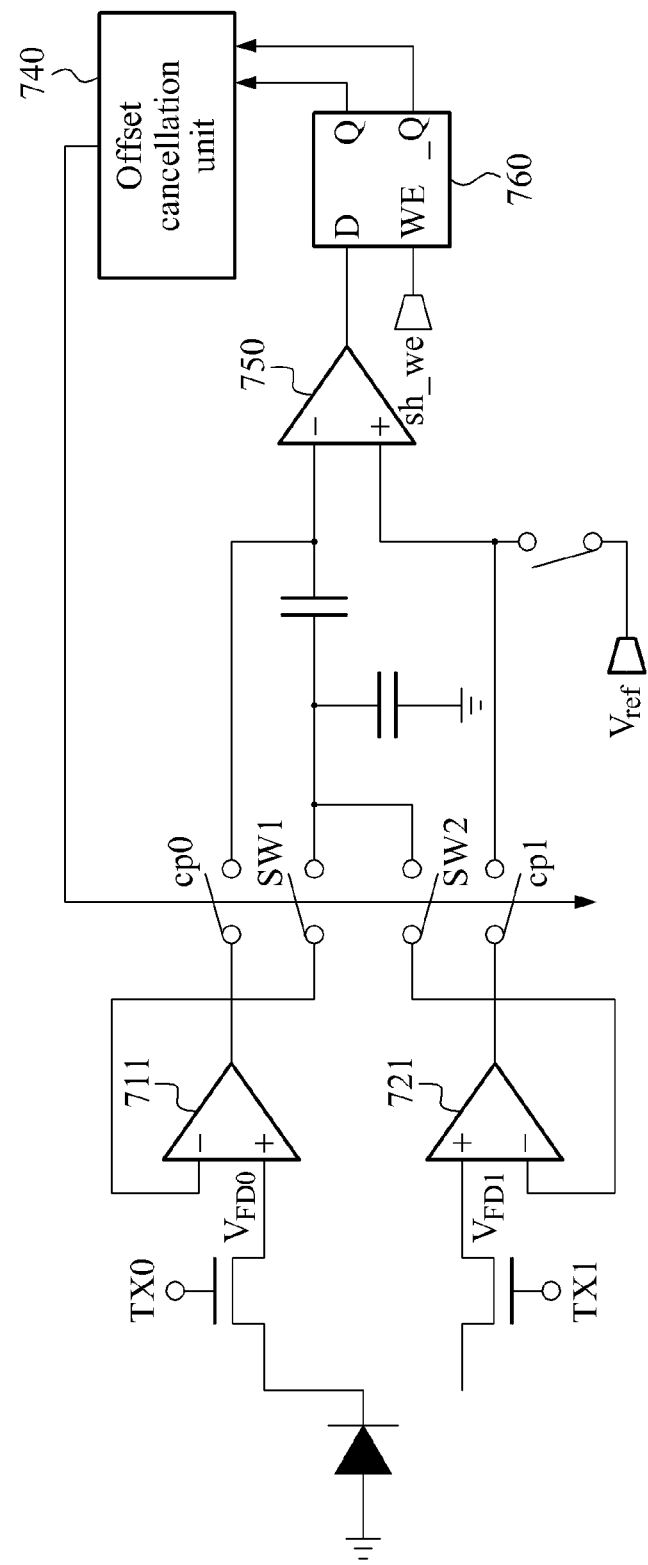
FIG. 12 illustrates a configuration of a circuit of a depth sensing apparatus to feed back a difference voltage between floating diffusion nodes according to an embodiment.

FIG. 12 illustrates a configuration of a circuit of a depth sensing apparatus to feed back a difference voltage between floating diffusion nodes according to an embodiment.

Referring to FIG. 12, the offset cancellation unit 740 may turn on cp0 SW and cp1 SW, and may compare a voltage of FD0 and a voltage of FD1 using the comparator 750. A comparison operation of the comparator 750 may be referred to as sign estimation. When an output value of the comparator 750 has a negative sign, that is, when the voltage of FD0, for example, the first floating diffusion node 710, is greater than the voltage of FD1, for example, the second floating diffusion node 720, the offset cancellation unit 740 may initially turn on SW1 and then turn on SW2. For example, the offset cancellation unit 740 may operate SW1 and SW2 to be similar to timing of FIG. 10. Here, $V_{OUT}$ is the same as Equation 5 and thus, $V_{OUT}$ may have a value greater than $V_{ref}$. This $V_{OUT}$ may be fed back to FD1 through SW6 control of the feedback controller 770 of FIG. 13.

When the voltage of FD0, for example, the first floating diffusion node 710, is less than or equal to the voltage of FD1, for example, the second floating diffusion node 720, the offset cancellation unit 740 may operate SW1 and SW2 in an order opposite to the aforementioned example by turning on SW2 and then turning on SW1. In this example, $V_{OUT}$ may be expressed by the following Equation 6, and may be fed back to FD0 through SW5 control of the feedback controller 770 of FIG. 13

$$V_{OUT} = V_{ref} + (V_{ph180} - V_{ph0}) \quad\text{[Equation 6]}$$

Through the aforementioned operation, the depth sensing apparatus according to an embodiment may maintain the voltage of FD0 and the voltage of FD1 to be greater than $V_{ref}$ at all times.

The controller 360 of FIG. 3 may easily verify which voltage is greater between the voltage of FD0 and the voltage FD1 by reading the sign of the output value of the comparator 750.

Figure 13:
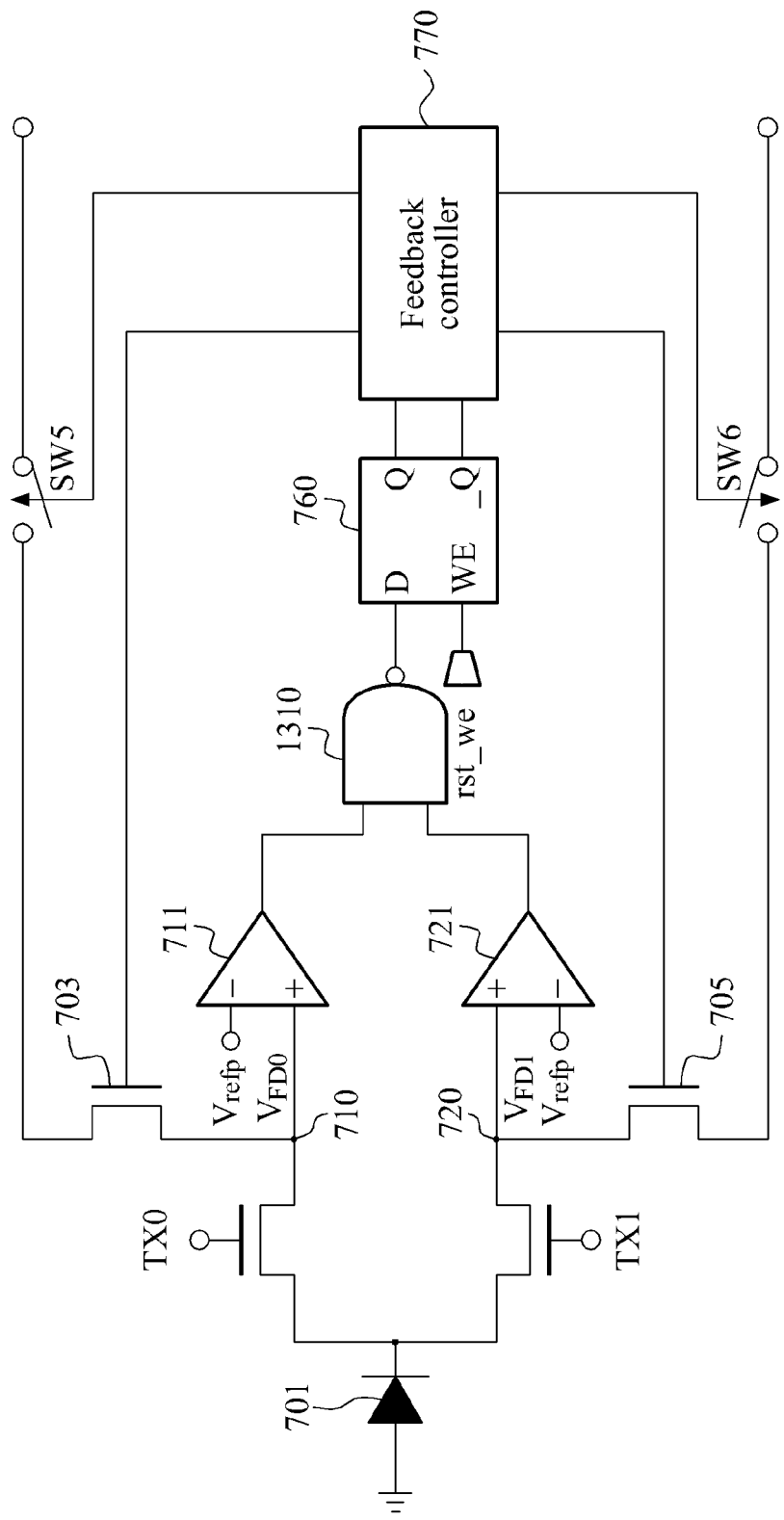
FIG. 13 illustrates a configuration of a circuit of a depth sensing apparatus to adjust feedback timing according to an embodiment.

FIG. 13 illustrates a configuration of a circuit of a depth sensing apparatus to adjust feedback timing according to an embodiment.

In the case of storing a predetermined value in a floating diffusion node, for example, the first floating diffusion node 710 and the second floating diffusion node 720, it is possible to use a reset transistor, for example, the reset transistors 703 and 705, within a pixel. However, due to the reset transistors 703 and 705, kTC noise may be accompanied.

When feedback is performed every sub-integration period, kTC noise may be accumulated and thus, accuracy of a depth value may be degraded. The floating diffusion node may be affected by strong background light and thereby quickly saturated and thus, a sub-integration period needs to be shortened. However, in the case of a predetermined pixel, the floating diffusion node may be affected by weak background light and thus, saturation thereof may be delayed.

Accordingly, when an operation of a sub-integration period is performed in a state in which saturation is incomplete for each pixel, only kTC may be unnecessarily added.

Referring to FIG. 13, when feedback of a unity gain amplifier, for example, the first unity gain amplifier 711 and the second unity gain amplifier 721, is discontinued, the unity gain amplifier may operate as the comparator 750 and thus, may be used to compare a predetermined voltage $V_{refp}$ and a voltage of a floating diffusion node, for example, the first floating diffusion node 710 and the second floating diffusion node 720.

By using the comparison result of the unity gain amplifier operating as the comparator 750 as a reset enable value, the processing unit 720 may control the feedback controller 770 not to perform an unnecessary feedback operation.

A logic calculator 1310 may calculate a reset enable signal by using, as an input, the comparison result. When one of a voltage of the first floating diffusion node 710 and a voltage of the second floating diffusion node 720 is less than a reference voltage $V_{refp}$, the logic calculator 1310 may calculate the resent enable signal as "1". Also, when both of the voltage of the first floating diffusion node 710 and the voltage of the second floating diffusion node 720 are greater than the reference voltage $V_{refp}$, the logic calculator 1310 may calculate the reset enable signal as "0".

When the reset enable signal is "1", the feedback controller 770 may normally feed back a difference voltage between the first floating diffusion node 710 and the second floating diffusion node 720.

When the reset enable signal is "0", one of the first floating diffusion node 710 and the second floating diffusion node 720 may not be saturated and thus, the feedback controller 770 may enable the difference voltage between the first floating diffusion node 710 and the second floating diffusion node 720 not to be fed back to a floating diffusion node.

For example, the feedback controller 770 may determine whether to feed back the difference voltage between the first floating diffusion node 710 and the second floating diffusion node 720 by determining saturation for each pixel after a sub-integration interval.

Accordingly, all of the pixels may have an optimized sub-integration period based on the decision of the feedback controller 770. When the background light of a pixel is small, it is possible to decrease kTC noise by increasing a sub-integration period. A reset may be controlled based on the background light for each pixel and thus, it may be referred to as an adaptive reset.

Figure 14:
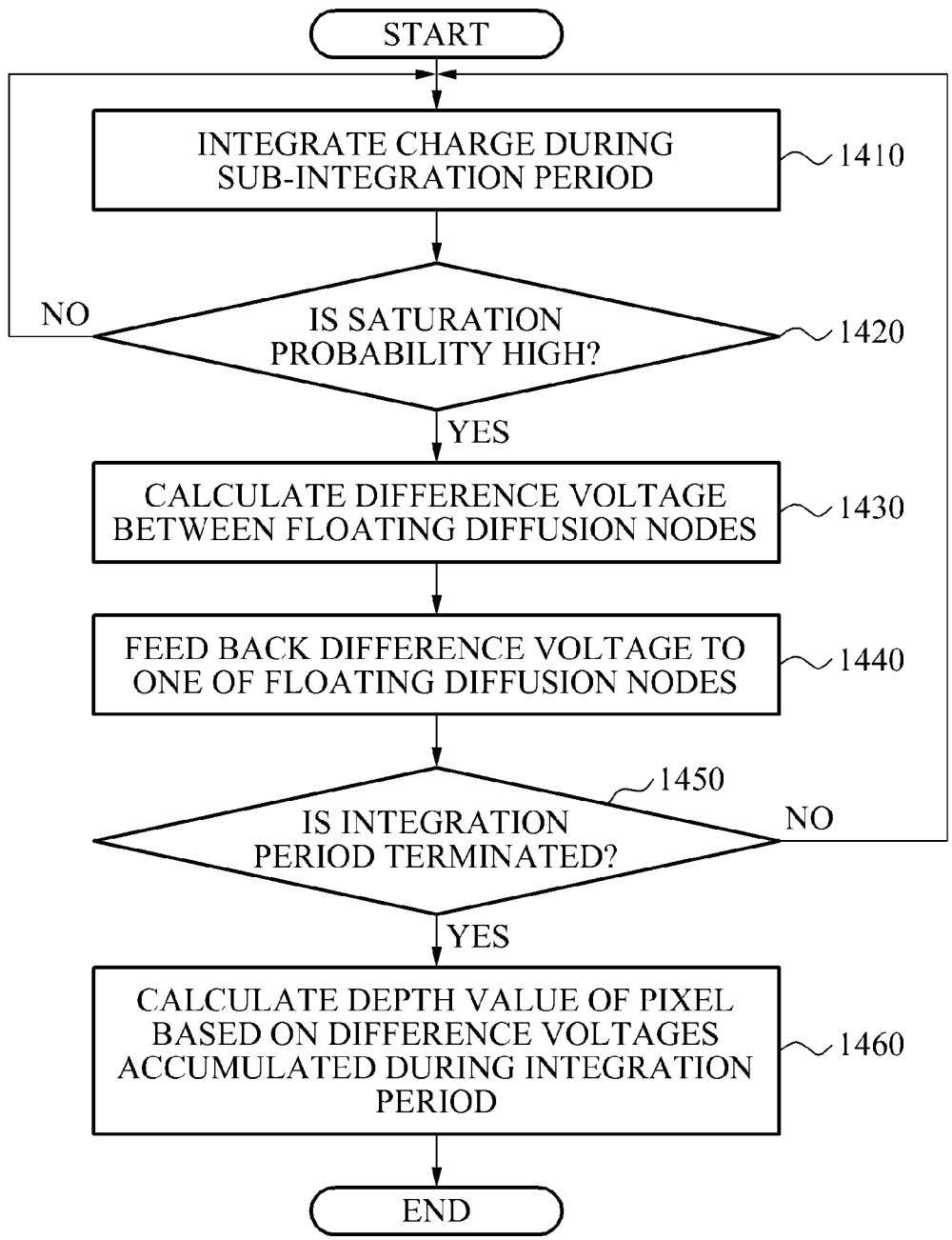
FIG. 14 illustrates a depth sensing method according to an embodiment.

FIG. 14 illustrates a depth sensing method according to an embodiment.

In operation 1410, a depth sensing apparatus according to an embodiment may integrate charge supplied from a photodiode in a first floating diffusion node and a second floating diffusion node during a predetermined sub-integration period.

In operation 1420, the depth sensing apparatus may verify whether a saturation probability is high in the first floating diffusion node and the second floating diffusion node.

For example, when both a voltage of the first floating diffusion node and a voltage of the second floating diffusion node are higher than a reference voltage, the depth sensing apparatus may determine that the saturation probability is low. When at least one of the voltage of the first floating diffusion node and the voltage of the second floating diffusion node is less than or equal to the reference voltage, the depth sensing apparatus may determine that the saturation probability is high.

When the saturation probability that the saturation may occur in the first floating diffusion node and the second floating diffusion node is determined to be low, the depth sensing apparatus may return to operation 1410 and may perform again the sub-integration period.

On the other hand, when the saturation probability that the saturation may occur in the first floating diffusion node and the second floating diffusion node is determined to be high, the depth sensing apparatus may calculate a difference voltage between the first floating diffusion node and the second floating diffusion node in operation 1430.

The depth sensing apparatus may calculate the difference voltage between the first floating diffusion node and the second floating diffusion node, based on a voltage of a photodiode stored in the first floating diffusion node in a first phase interval and a voltage of the photodiode stored in the second floating diffusion node in a second phase interval, using a sub-integration period.

The depth sensing apparatus may cancel an offset of a first unity gain amplifier and an offset of a second unity gain amplifier by controlling operation timing of a first switch connecting the first unity gain amplifier and an input end of a CDS amplifier, a second switch connecting the second unity gain amplifier and the CDS amplifier, a third switch connecting a feedback capacitor and the CDS amplifier, a fourth switch of the CDS amplifier, a fifth switch connecting an output end of the CDS amplifier and the first floating diffusion node, and a sixth switch connecting the output end of the CDS amplifier and the second floating diffusion node.

In operation 1440, the depth sensing apparatus may feed back the difference voltage to one of the first floating diffusion node and the second floating diffusion node based on the comparison result between the voltage of first floating diffusion node and the voltage of the second floating diffusion node.

For example, when the voltage of the first floating diffusion node is greater than the voltage of the second floating diffusion node, the depth sensing apparatus may feed back the difference voltage to the second floating diffusion node. When the voltage of the second floating diffusion node is greater than the voltage of the first floating diffusion node, the depth sensing apparatus may feed back the difference voltage to the first floating diffusion node.

In operation 1450, the depth sensing apparatus may verify whether an integration period is terminated.

When the integration period is not terminated, the depth sensing apparatus may return to operation 1410 and perform the sub-integration period in operation 1440.

On the other hand, when the integration period is terminated, the depth sensing apparatus may calculate a depth value of a pixel based on difference voltages accumulated in the integration period in operation 1460.

According to an embodiment, a depth sensing apparatus may minimize an effect of noise that may occur due to charge generated by background noise, by accumulating charge stored in a floating diffusion node based on a sub-integration period.

Also, the depth sensing apparatus may prevent a saturation of the floating diffusion node by determining a floating diffusion node to which the difference voltage between floating diffusion nodes is to be fed back, based on the comparison result between voltages of the floating diffusion nodes.

Also, in the case of accumulating charge based on a sub-integration period, the depth sensing apparatus may maintain an effect of difference voltage accumulation using a unity gain amplifier.

Also, the depth sensing apparatus may cancel an offset of a unity gain amplifier by determining an operation order of a switch through sign estimation, and may accurately calculate a difference voltage between floating diffusion nodes by cancelling the offset of the unity gain amplifier.

Also, the depth sensing apparatus may minimize an effect of noise that may occur due to frequent feedback by determining a feedback point in time of the difference voltage based on the comparison result between a voltage of a floating diffusion node and a reference voltage.

Accordingly, the depth sensing apparatus may acquire an accuracy enhanced depth image in both an indoor environment and an outdoor environment. Further, a proposed pixel structure may be used for a depth sensor and a sensor of simultaneously acquiring a color and a depth.

The above-described embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. The computer-readable media may also be a distributed network, so that the program instructions are stored and executed in a distributed fashion. The program instructions may be executed by one or more processors. The computer-readable media may also be embodied in at least one application specific integrated circuit (ASIC) or Field Programmable Gate Array (FPGA), which executes (processes like a processor) program instructions. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

Although embodiments have been shown and described, it would be appreciated by those skilled in the art that changes may be made in these embodiments without departing from the principles and spirit of the disclosure, the scope of which is defined by the claims and their equivalents.

What is claimed is:

1. A depth sensing apparatus, comprising:
a calculator to calculate, using a sub-integration period, a difference voltage between a first floating diffusion node and a second floating diffusion node based on a voltage of a photodiode stored in the first floating diffusion node in a first phase interval and a voltage of the photodiode stored in the second floating diffusion node in a second phase interval;
a feedback unit to feed back the difference voltage to one of the first floating diffusion node and the second floating diffusion node based on a comparison between a voltage of the first floating diffusion node and a voltage of the second floating diffusion node; and
a controller to calculate a depth value of a pixel based on difference voltages accumulated during an integration period including sub-integration periods.

2. The depth sensing apparatus of claim 1, wherein the controller comprises:
a measurement unit to measure the voltage of the first floating diffusion node using a first unity gain amplifier and to measure the voltage of the second floating diffusion node using a second unity gain amplifier.

3. The depth sensing apparatus of claim 2, wherein a positive input end of at least one of the first unity gain amplifier and the second unity gain amplifier is included in a pixel circuit, and a remaining configuration is included in a column circuit.

4. The depth sensing apparatus of claim 2, wherein at least one of the first unity gain amplifier and the second unity gain amplifier is included in a pixel circuit.

5. The depth sensing apparatus of claim 2, wherein the controller further comprises:
an offset cancellation unit to cancel an offset of the first unity gain amplifier and an offset of the second unity gain amplifier by controlling operation timing of a first switch connecting the first unity gain amplifier and an input end of a correlated double sampling (CDS) amplifier, a second switch connecting the second unity gain amplifier and the CDS amplifier, a third switch connecting a feedback capacitor and the CDS amplifier, a fourth switch of the CDS amplifier, a fifth switch connecting an output end of the CDS amplifier and the first floating diffusion node, and a sixth switch connecting the output end of the CDS amplifier and the second floating diffusion node.

6. The depth sensing apparatus of claim 5, wherein the offset cancellation unit is configured to
turn on the first switch, the third switch, and the fourth switch when the voltage of the first floating diffusion node is greater than the voltage of the second floating diffusion node,
turn off the first switch and the fourth switch, and then turn on the second switch,
turn off the second switch and the third switch, and then turn on the fourth switch, the fifth switch, and the sixth switch, to thereby reset the voltage of the first floating diffusion node and the voltage of the second floating diffusion node to a reference voltage,
turn off the fifth switch and the sixth switch, and then turn on the second switch, and
turn off the second switch and the fourth switch, and then turn on the first switch and the third switch, thereby cancelling the offset of the first unity gain amplifier and the offset of the second unity gain amplifier.

7. The depth sensing apparatus of claim 5, wherein the offset cancellation unit is configured to
turn on the second switch, the third switch, and the fourth switch when the voltage of the floating diffusion node is less than or equal to the voltage of the second floating diffusion node,
turn off the second switch and the fourth switch, and then turn on the first switch,
turn off the first switch and the third switch, and then turn on the fourth switch, the fifth switch, and the sixth switch to thereby reset the voltage of the first floating diffusion node and the voltage of the second floating diffusion node to a reference voltage,
turn off the fifth switch and the sixth switch, and then turn on the first switch, and
turn off the first switch and the fourth switch, and then turn on the second switch and the third switch, thereby cancelling the offset of the first unity gain amplifier and the offset of the second unity gain amplifier.

8. The depth sensing apparatus of claim 1, wherein the controller comprises:
a comparator to compare the voltage of the first floating diffusion node to the voltage of the second floating diffusion node.

9. The depth sensing apparatus of claim 1, wherein the controller comprises:
a resetting unit to reset, to a reference voltage, a remaining floating diffusion node to which the difference voltage is not fed back between the first floating diffusion node and the second floating diffusion node.

10. The depth sensing apparatus of claim 1, wherein a first phase and a second phase have a phase difference of 180 degrees with respect to each other.

11. The depth sensing apparatus of claim 1, wherein the feedback unit is configured to at least one of
feed back the difference voltage to the second floating diffusion node when the voltage of the first floating diffusion node is greater than the voltage of the second floating diffusion node, and
feed back the difference voltage to the first floating diffusion node when the voltage of the first floating diffusion node is less than or equal to the voltage of the second floating diffusion node.

12. A depth sensing apparatus, comprising:
a calculator to calculate, using a sub-integration period, a difference voltage between a first floating diffusion node and a second floating diffusion node based on a voltage of a photodiode stored in the first floating diffusion node in a first phase interval and a voltage of the photodiode stored in the second floating diffusion node in a second phase interval;
a feedback unit to feed back the difference voltage to one of the first floating diffusion node and the second floating diffusion node; and
a controller to calculate a depth value of a pixel based on difference voltages accumulated during an integration period comprising sub-integration periods, the controller including a comparator to compare a voltage of the first floating diffusion node to a voltage of the second floating diffusion node, wherein the feedback unit is further configured to
feed back the difference voltage to the second floating diffusion node when the voltage of the first floating diffusion node is greater than the voltage of the second floating diffusion node, based on the comparison result, and
feed back the difference voltage to the first floating diffusion node when the voltage of the first floating diffusion node is less than or equal to the voltage of the second floating diffusion node based on the comparison result.

13. The depth sensing apparatus of claim 12, wherein the controller further comprises:
a feedback controller to determine that a saturation probability of the first floating diffusion node and the second floating diffusion node is greater than or equal to a saturation probability in an interval in which at least one of the voltage of the first floating diffusion node and the voltage of the second floating diffusion node is less than or equal to a reference voltage, and to control the feedback unit to perform the feedback.

14. The depth sensing apparatus of claim 13, wherein the feedback controller is configured to determine that the saturation probability of the first floating diffusion node and the second floating diffusion node is less than the saturation probability in an interval in which the voltage of the first floating diffusion node and the voltage of the second floating diffusion node are greater than the reference voltage, and to control the feedback unit not to perform the feedback.

15. A depth sensing method, comprising:
calculating, using a sub-integration period, a difference voltage between a first floating diffusion node and a second floating diffusion node based on a voltage of a photodiode stored in the first floating diffusion node in a first phase interval and a voltage of the photodiode stored in the second floating diffusion node in a second phase interval;
feeding back the difference voltage to one of the first floating diffusion node and the second floating diffusion node based on a comparison between a voltage of the first floating diffusion node and a voltage of the second floating diffusion node; and
calculating a depth value of a pixel based on difference voltages accumulated during an integration period including sub-integration periods.

16. The method of claim 15, further comprising:
measuring a voltage of the first floating diffusion node using a first unity gain amplifier; and
measuring a voltage of the second floating diffusion node using a second unity gain amplifier.

17. The method of claim 16, further comprising:
cancelling an offset of the first unity gain amplifier and an offset of the second unity gain amplifier by controlling operation timing of a first switch connecting the first unity gain amplifier and an input end of a correlated double sampling (CDS) amplifier, a second switch connecting the second unity gain amplifier and the CDS amplifier, a third switch connecting a feedback capacitor and the CDS amplifier, a fourth switch of the CDS amplifier, a fifth switch connecting an output end of the CDS amplifier and the first floating diffusion node, and a sixth switch connecting the output end of the CDS amplifier and the second floating diffusion node.

18. The method of claim 17, wherein the cancelling comprises:
turning on the first switch, the third switch, and the fourth switch when the voltage of the first floating diffusion node is greater than the voltage of the second floating diffusion node;
turning off the first switch and the fourth switch, and then turning on the second switch;
turning off the second switch and the third switch, and then turning on the fourth switch, the fifth switch, and the sixth switch, to thereby reset the voltage of the first floating diffusion node and the voltage of the second floating diffusion node to a reference voltage;
turning off the fifth switch and the sixth switch, and then turning on the second switch; and
turning off the second switch and the fourth switch, and then turning on the first switch and the third switch, thereby cancelling the offset of the first unity gain amplifier and the offset of the second unity gain amplifier.

19. The method of claim 17, wherein the cancelling comprises:
turning on the second switch, the third switch, and the fourth switch when the voltage of the first floating diffusion node is less than or equal to the voltage of the second floating diffusion node;
turning off the second switch and the fourth switch, and then turning on the first switch;
turning off the first switch and the third switch, and then turning on the fourth switch, the fifth switch, and the sixth switch to thereby reset the voltage of the first floating diffusion node and the voltage of the second floating diffusion node to a reference voltage;
turning off the fifth switch and the sixth switch, and then turning on the first switch; and
turning off the first switch and the fourth switch, and then turning on the second switch and the third switch, thereby cancelling the offset of the first unity gain amplifier and the offset of the second unity gain amplifier.

20. The method of claim 15, further comprising:
comparing the voltage of the first floating diffusion node and the voltage of the second floating diffusion node.

21. The method of claim 15, further comprising:
resetting, to a reference voltage, a remaining floating diffusion node to which the difference voltage is not fed back between the first floating diffusion node and the second floating diffusion node.

22. A non-transitory computer-readable recording medium storing a program to implement the method of claim 15.

23. A depth sensing method, comprising:
calculating, using a sub-integration period, a difference voltage between a first floating diffusion node and a second floating diffusion node based on a voltage of a photodiode stored in the first floating diffusion node in a first phase interval and a voltage of the photodiode stored in the second floating diffusion node in a second phase interval;
comparing a voltage of the first floating diffusion node and a voltage of the second floating diffusion node;
feeding back the difference voltage to one of the first floating diffusion node and the second floating diffusion node; and
calculating a depth value of a pixel based on difference voltages accumulated during an integration period comprising sub-integration periods, wherein
the feeding back includes,
feeding back the difference voltage to the second floating diffusion node when the voltage of the first floating diffusion node is greater than the voltage of the second floating diffusion node based on the comparison result, and feeding back the difference voltage to the first floating diffusion node when the voltage of the first floating diffusion node is less than or equal to the voltage of the second floating diffusion node based on the comparison result.

24. The method of claim 23, further comprising:

controlling the feedback to be performed by determining that a saturation probability of the first floating diffusion node and the second floating diffusion node is greater than or equal to a saturation probability in an interval in which at least one of the voltage of the first floating diffusion node and the voltage of the second floating diffusion node is less than or equal to a reference voltage.

25. The method of claim 24, wherein the controlling comprises controlling the feedback not to be performed by determining that the saturation probability of the first floating diffusion node and the second floating diffusion node is less than the saturation probability in an interval in which the voltage of the first floating diffusion node and the voltage of the second floating diffusion node are greater than the reference voltage.

26. A method for obtaining a depth value of a pixel, the method comprising:

collecting a pixel charge in a first floating diffusion node and a second floating diffusion node;

determining a voltage difference between a voltage of the first floating diffusion node and a voltage of the second floating diffusion node;

determining which of the voltage of the first floating diffusion node and the voltage of the second floating diffusion node is farthest from a saturation value;

resetting the voltage of the first floating diffusion node and the voltage of the second floating diffusion node to a reference voltage;

storing the voltage difference in a floating diffusion node from among the first floating diffusion node and the second floating diffusion node determined to have the voltage farthest from the saturation value; and calculating the depth value based on the stored voltage difference.

27. The method of claim 26, further comprising:

determining whether at least one of the voltage of the first floating diffusion node and the voltage of the second floating diffusion node is within a threshold value of a saturation value.

\* \* \* \* \*